United States Patent [19]

Halder et al.

[11] Patent Number: 4,853,620

[45] Date of Patent: Aug. 1, 1989

[54] CIRCUIT ARRANGEMENT COMPRISING MULTIPLIER CIRCUITS TO FIND THE SUM OF ELECTRICAL POWER OUTPUTS FOR APPLICATION IN MULTI-PHASE ELECTRICITY METERS

[75] Inventors: Mathis Halder, Baar; Andreas Joder, Unterägeri, both of Switzerland

[73] Assignee: LGZ Landis & Gyr Zug AG, Zug, Switzerland

[21] Appl. No.: 225,528

[22] Filed: Jul. 28, 1988

[30] Foreign Application Priority Data

Aug. 6, 1987 [CH] Switzerland ................. 03028/87

[51] Int. Cl.[4] .................. G01R 21/00; G01R 21/08
[52] U.S. Cl. .................. 324/142; 324/117 H; 324/117 R
[58] Field of Search ............. 324/142, 117 R, 117 H; 364/483, 571.01

[56] References Cited

U.S. PATENT DOCUMENTS

| | | |
|---|---|---|
| 3,875,508 | 4/1975 | Milkovic . |
| 3,921,069 | 11/1975 | Milkovic ................. 324/142 |
| 3,955,138 | 5/1976 | Milkovic . |
| 4,464,629 | 8/1984 | Tanaka et al. ............. 324/142 |
| 4,616,179 | 10/1986 | Braun ...................... 364/483 |
| 4,742,296 | 5/1988 | Petr et al. ................. 324/142 |
| 4,764,720 | 8/1988 | Nystrom .................. 324/142 |

FOREIGN PATENT DOCUMENTS

| | | |
|---|---|---|
| 0134001 | 3/1984 | European Pat. Off. . |
| 2951627 | 2/1981 | Fed. Rep. of Germany . |
| 58-28665 | 2/1983 | Japan . |
| 483021 | 1/1970 | Switzerland . |

*Primary Examiner*—Reinhard J. Eisenzopf
*Assistant Examiner*—W. Burns
*Attorney, Agent, or Firm*—Marmorek, Guttman & Rubenstein

[57] ABSTRACT

A circuit arrangement for finding a sum of electrical power outputs for use in a multi-phase electricity meter is disclosed. The circuit arrangement comprises a plurality of multiplier circuits arranged in sequence. The sequence of multiplier circuits has two poles which form the output poles of the circuit arrangement. Each multiplier circuit comprises a Hall element, an amplifier, and a polarity reversing switch.

4 Claims, 1 Drawing Sheet

1

CIRCUIT ARRANGEMENT COMPRISING MULTIPLIER CIRCUITS TO FIND THE SUM OF ELECTRICAL POWER OUTPUTS FOR APPLICATION IN MULTI-PHASE ELECTRICITY METERS

FIELD OF THE INVENTION

The present invention relates to a circuit arrangement for finding a sum of electrical power outputs which is particularly applicable in multi-phase electricity meters.

BACKGROUND OF THE INVENTION

Such circuit arrangements are used in multi-phase meters for example to measure the sum of electrical power outputs of all phases or in summing meters to measure the sum of any power outputs. The power outputs may be active power outputs, wattless power outputs or apparent power outputs in this instance. This sum is then integrated over a period of time in electricity meters in order to give the corresponding energy value which is then displayed.

A configuration of the type mentioned above is known from CH-PS No. 483 021. In this configuration, Hall elements with resistances and their total output voltage are loaded with a relatively low-ohm, low-pass filter. The portion of direct current in the total output voltage requires an amplifier of relatively complicated construction with phase-sensitive control of a rectifier to improve the precision of the arrangement.

It is an object of the instant invention to provide a circuit arrangement of the type mentioned above, with Hall elements that are not loaded with resistances, having no low-pass filter and requiring no amplifier of complicated construction.

SUMMARY OF THE INVENTION

The present invention is a circuit arrangement for finding a sum of electrical power outputs for use in a multi-phase electricity meter. The circuit arrangement comprises a plurality of multiplier circuits connected in sequence. The sequence of multiplier circuits has two poles which form the output poles of the inventive circuit arrangement.

Each multiplier circuit comprises a Hall element, an amplifier, and a polarity reversing switch. Illustratively, one output of the Hall element is connected to an input of the amplifier by way of the polarity reversing switch and another output of the Hall element is connected to an output of the multiplier circuit by way of the polarity reversing switch. The output of the amplifier is connected to an input of the Hall element.

BRIEF DESCRIPTION OF THE DRAWING

Identical reference numbers designate identical elements in all figures of the drawing.

DETAILED DESCRIPTION OF THE INVENTION

Figure 1:
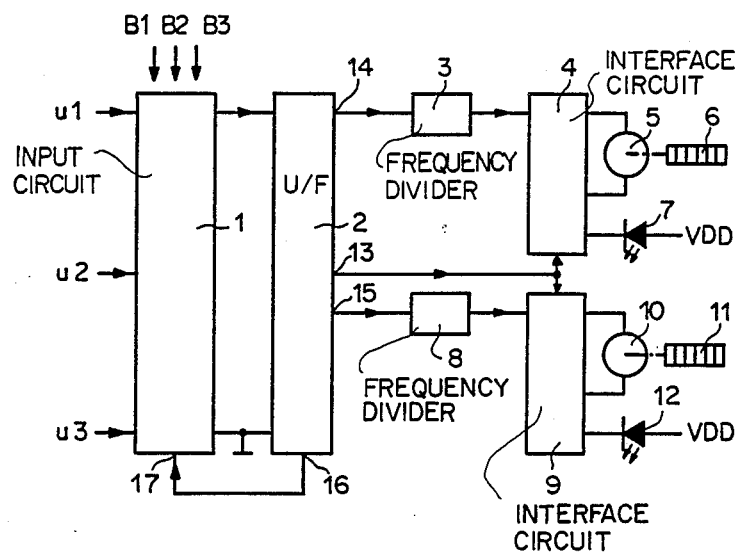
FIG. 1 shows a simplified block diagram of an electricity meter used to measure a sum of three energies, in accordance with an illustrative embodiment of the present invention.

The electricity meter shown in FIG. 1 is of a structure that is basically known and comprises an input circuit 1, a voltage/frequency converter 2, an optional first frequency divider 3, a first interface circuit 4, a first stepping motor 5, a first display 6, a first illuminated diode 7, an optional second frequency divider 8, a second interface circuit 9, a second stepping motor 10, a second display 11 and a second illuminated diode 12.

This electricity meter can be used for example to measure a three-phase energy, i.e. to measure the sum of three energies, each of which is characterized by a voltage uk and a current ik, where k=1, 2 or 3. The ik currents are converted in a basically known, and therefore not shown, manner into proportional inductions Bk of the magnetic field produced by each of them. Input circuit 1 is thus subjected to the influence of the three inductions B1, B2 and B3 and has as its input voltage the three voltages u1, u2 and u3. The output of the input circuit 1 is connected via two poles to the input of the voltage/frequency converter 2, whereby one pole is grounded. The voltage/frequency converter 2 is provided with a first clock output 13, a data output 14 for positive energy, a data output 15 for negative energy and a second clock output 16. The data output 14 or 15 of the voltage/frequency converter 2 is connected to the input of the component group 3; 4; 5; 7 or 8; 9; 10; 11; 12 used to measure and display the positive or negative energy. Data output 14 or 15 of the voltage/frequency converter 2 is transmitted via frequency divider 3 or 8 if present, or else directly to a data input of the interface circuit 4 or 9. The first clock output 13 of the voltage/frequency converter 2 is connected to the clock input of the interface circuit 4 and with that of interface circuit 9 while the second clock output 16 is connected directly to a clock input of the input circuit 1. A two-pole output of each of the interface circuits 4 and 9 supplies a stepping motor 5 or 10, each of which mechanically activates a display 6 or 11. Instead of the component groups 5; 6 and 10; 11 it is also possible to use purely electronic component groups which could for example compare a series connection of a binary counter and of a 7-segment display made of illuminated diodes or liquid crystals. In that case the binary counters are preferably built from non-volatile memories so that the information contained cannot be lost in case of a current failure. A single pole time-serial output of the interface circuits 4 and 9 can for example supply the cathode of the illuminated diode 7 or 12, the anode of which is in each case connected to the positive pole VDD of a DC current supply. In the input circuit 1 the products u1×B1, u2×B2 and u3×B3 representing the corresponding single-phase outputs are calculated and added up with the total value being reversed in polarity periodically so that an electric voltage appears at the output of the input circuit 1, proportional to this periodically polarity reversed total value. The periodical polarity reversal is cancelled out in the voltage/frequency converter 2 through a synchronous second polarity reversal. Both polarity reversals serve to eliminate error signals such as "Offset" voltages or other DC interference signals which affect measuring precision and which are polarity reversed only once instead of twice. The synchronous double polarity reversal is carried out by means of a clock signal produced in the voltage/frequency converter 2 which feeds the clock input 17 of the input circuit 1 via the second clock output 16 of the voltage/frequency converter 2. Furthermore, the voltage/ frequency converter 2 converts the output voltage of the input circuit 1 into a sequence of rectangular pulses having a frequency that is proportional to the output voltage of the input circuit 1. The design of the voltage/frequency converter 1 is described for example in the EP application No. 86108493.7 and in U.S. application Ser. No. 06/904,045, the contents of which are incorporated herein by reference.

The pulse frequency at the data output 14 or 15 of the voltage/frequency converter 2 is thus proportional to the positive or negative sum of electrical power outputs and can be furthermore divided by a constant in frequency divider 3 or 8 if necessary. The voltage as well as the current of the sequence of pulses are then adapted in a basically known manner to the requirements of the stepping motor 5 or 10 which counts the pulses, thereby integrating the sum of the power outputs in time, thus converting them into the sum of energies. This energy sum is displayed by display 6 (positive energy) and/or 11 (negative energy). Furthermore, the presence of the illuminated diodes 7 and 12 (one for the positive and the other for the negative sum of outputs) which blink in time with the pulse frequencies, makes it possible to measure by means of an external optical device the pulse frequencies which, as mentioned earlier, are proportional to the sum of outputs and to evaluate them there, e.g. by means of an integration.

It is obvious that if only one type of positive or negative energy is present and must be measured, one of the two component groups 3; 4; 5; 6; 7 or 8; 9; 10; 11; 12 is superfluous and may be omitted.

Figure 2:
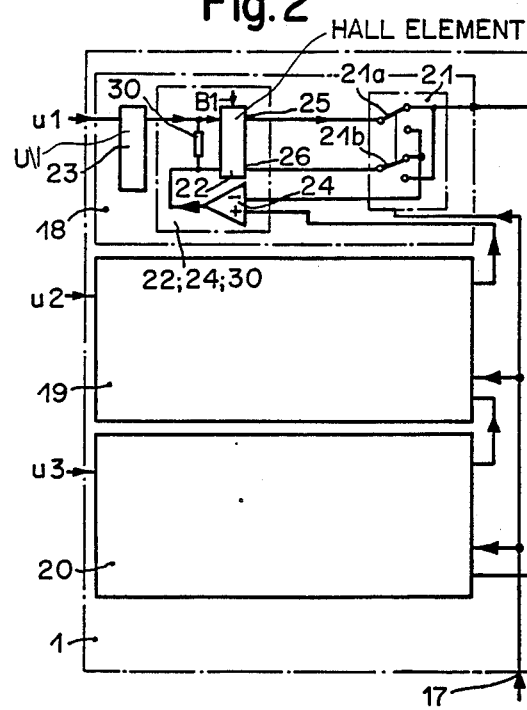
FIG. 2 shows a block diagram of a first embodiment of the input circuit of the electricity meter shown in FIG. 1, in accordance with an illustrative embodiment of the present invention.

The block diagram of FIG. 2 represents a first embodiment of the input circuit 1 and can comprise, for example, three multiplier circuits 18, 19 and 20, all three of identical construction. The first multiplier circuit 18 has voltage u1 as its input signal and is subjected to induction B1. The second multiplier circuit 19 has voltage u2 as its input signal and is subjected to induction B2 (not shown). The third multiplier circuit 20 has voltage u3 as its input signal and is subjected to the induction B3 (not shown).

The three multiplier circuits 18 to 20 are sequentially connected to form the input circuit 1, which has an two output poles.

The internal design of the three identical multiplier circuits 18 to 20 are shown in FIG. 2 for the multiplier circuit 18 only and comprises in each instance a polarity reversing switch 21 functioning as a polarity reverser, a Hall element 22, a voltage/current converter 23, an amplifier 24 and a temperature-dependent resistance 30 that is optional. For each Hall element 22 an amplifier 24 is thus provided, and for each amplifier 24 a polarity reversing switch is provided. Each amplifier 24 is provided with a two-pole input, i.e. with one inverting and one non-inverting input. The amplifier may comprise, for example, an operational amplifier.

The polarity reversing switch 21 is equipped with two contacts 21a and 21b which may be mechanically coupled to each other, for example. Inside the polarity reversing switch 21, the first input pole is connected to the first output pole when the contact 21a is in a first position (shown in FIG. 2) and is connected to the second output pole when the contact 21a is in a second position (not shown in FIG. 2). Similarly, the second input pole of the polarity reversing switch 21 is connected to the second output pole when the contact 21b is in a first position (shown in FIG. 2) and is connected to the first output pole when the contact 21b is in a second position (not shown in FIG. 2). The clock input 17 of the input circuit 1 is connected to the control input of all three polarity reversing switches to control the positions of the contacts 219, 216.

The Hall element 22 is subjected to the Bk induction. The input of the voltage/current converter 23 is supplied by the uk voltage. In this case k=1 applies to the multiplier circuit 18, k=2 to the multiplier circuit 19 and k=3 to the multiplier circuit 20. The output of the voltage/current converter 23 is connected to a first supply current input of the Hall element 22 and thereby to an input of the Hall element circuit 22; 24; 30. The outputs 25; 26 of the Hall element 22 are connected to the inputs of the corresponding polarity reversing switch 21. The first output pole of the polarity reversing switch 21 constitutes the first output pole of the multiplier circuit 18, 19 or 20 and the second output pole of the polarity reversing switch 21 is connected to an inverting input of the amplifier 24. The non-inverting input of the amplifier 24 constitutes a second input of the multiplier circuit 18, 19, 20 which is connected to an adjacent circuit (e.g. the non-inverting input of amplifier 24 in multiplier 18 is connected to the output of multiplier 19). One output of the Hall element 22 is thus connected via one of the contacts 21a, 21b of the corresponding polarity reversing switch 21 to an input (i.e. the inverting input) of the corresponding amplifier 24. The other output of the Hall element is connected via the other contact 21a, 21b of the corresponding polarity reversing switch 21 to the output of the corresponding multiplier circuit 18, 19 or 20. The output of the amplifier 24 is always connected to a second supply current input of the Hall element 22 and thereby to a pole of the input of the corresponding Hall element circuit 22; 24; 30.

The uk voltage is transformed in the voltage/current converter 23 into a proportional current supplying the Hall element 22. The Hall element 22 effects the product of this current and of the induction Bk, so that its output voltage is proportional to $uk \times Bk$ and thereby proportional to the power output $uk \times ik$. Through the serial connection of the outputs of the multiplier circuits 18, 19 and 20 the sum of the outputs is produced, i.e. $(+/-)u1 \times i1 +(+/-)u2 \times i2 +(+/-)u3 \times i3$. In this case all the amplifiers 24 function as control amplifiers, whereby the actual value of each control circuit is the voltage potential of one of the two output poles 26 or 25 of the corresponding Hall element 22, depending upon the position of the polarity reversing switch 21. The predetermined value of each control circuit at each non-inverting input of the amplifier 24 is the voltage potential of the other output pole 25 or 26 of the preceding Hall element 22 (i.e. the poll of the Hall element which forms the output of the preceding multiplier circuit), whereby the predetermined value of the first control circuit is the ground. In that case a voltage occurs at the output of each amplifier 24 which is proportional to the predetermined value/actual value difference of the applicable control circuit and which counteracts the voltage potential at the output pole 26 or 25 of the corresponding Hall element 22 in such manner that the predetermined value/actual value difference approaches zero. When this is the case, the voltage potential of the output poles 26, 25 corresponding Hall element approaches the predetermined value. At the clock input 17 of the input circuit 1 a periodic rectangular signal occurs and reverses the polarity reversing switches 21 synchronously and periodically. The periodic reversal of the switches 21 causes the polarity of the voltage occurring at the serial connection of the outputs of the multiplier circuits 18, 19 and 20 to be polarity reversed.

Figure 3:
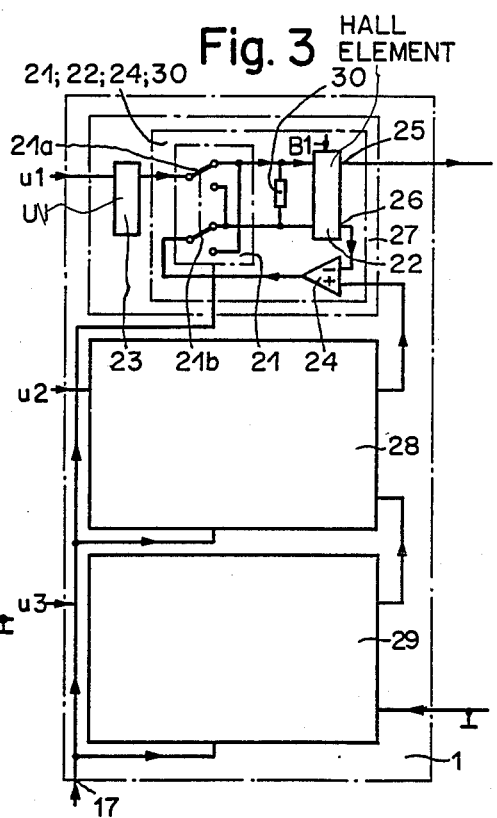
FIG. 3 shows a block diagram of a second embodiment of the input circuit of the electricity meter shown in FIG. 1, in accordance with an illustrative embodiment of the present invention.

The block diagram of FIG. 3 shows a second embodiment of the input circuit 1 and comprises three multiplier circuits 27, 28 and 29, all three being again identical in construction. The first multiplier circuit 27 has the voltage u1 as its input signal and is subjected to induction B1. The second multiplier circuit 28 has as its input signal voltage u2 and is subjected to induction B2 (in a manner that is not shown). The third multiplier circuit 29 has as its input signal voltage u3 and is subjected to induction B3 (in a manner not shown).

The three multiplier circuits 27 to 29 are again electrically connected in sequence with the two poles of this sequence of multiplier circuits constituting the output of input circuit 1 and thereby the output of the configuration according to the invention. The clock input 17 of the input circuit 1 is connected to a control input of the multiplier circuit 27, 28 and 29.

The construction of the three identical multiplier circuits 27 to 29 is shown in FIG. 3 for the multiplier circuit 27 only and comprises a Hall element 22, a voltage/current converter 23, a two-pole polarity reversing switch 21, an amplifier 24 and an optional temperature-dependent resistance 30. An amplifier 24 is thus provided here too for each Hall element 22. The multiplier circuits 27 to 29 according to FIG. 3 are similar in construction to the multiplier circuits 18 to 20 cf FIG. 2, with the difference that the output of the voltage/current converter 23 and of the amplifier 24 are not connected directly to the two-pole supply current input of the Hall element 22 but are connected to the inputs of the two-pole polarity reversing switch 21. An output of the Hall element 22 is directly connected to an inverting input of the corresponding amplifier 24 without going via the polarity reversing switch 21. A two-pole switch 21 which functions as a polarity reversing switch is thus provided for each Hall element 22 and thereby also for each amplifier 24. The output of the amplifier 24 is connected via a switch contact 21b of the corresponding switch 21 to a pole of the supply current input of the corresponding Hall element 22 and thereby directly to a pole of the input of the corresponding Hall element circuit 21; 22; 24; 30, while the pole of the input of the Hall element circuit 21; 22; 24; 20 which is not directly connected to the output of the amplifier 24 is connected to the other pole of the supply current input of the corresponding Hall element 22 via the other switch contact 21a. The control input of the switch 21 constitutes here in each instance the control input of the multiplier circuit 27, 28 or 29. The switch 21 of FIG. 3 is constructed and wired exactly as the switch 21 of FIG. 2.

The circuit according to FIG. 3 functions similarly to the circuit of FIG. 2, in particular the amplifier 24 functions here too as a control amplifier, exactly as in the circuit of FIG. 2.

Since the desired signal delivered by the voltage/current converter 23 is reversed by the change-over switch 21 before reaching the Hall element 22, this change of polarity has no influence upon the polarity of the portion of the interference of the output voltage of Hall element 22 which is produced internally in said Hall element 22. The polarity of this portion of interference is thus independent of e.g. the periodic polarity reversal of the desired signal and can therefore be eliminated in a basically known manner in the downstream voltage/current converter 2 (see FIG. 1) with relative ease.

FIGS. 2 and 3 furthermore show an entirely optional temperature-dependent resistance 30 which is connected in parallel to the two-pole supply current input of the Hall element 22. It is used for temperature compensation.

The polarity reversing switch 21 has been represented in form of an electro-mechanical switch in the figures. In practice it is preferably a semi-conductor switch. Each of the voltage/current converters 23 preferably comprises a resistance.

Finally, the above described embodiments of the invention are intended to be illustrative only. Numerous alternative embodiments may be devised without departing from the spirit and scope of the following claims.

We claim:

1. A circuit arrangement for finding a sum of electrical power outputs for use in a multi-phase electricity meter, said circuit arrangement comprising:

a plurality of multiplier circuits arranged in sequence, said sequence of multiplier circuits having two poles which form the output poles of the circuit arrangement;

at least one multiplier circuit comprising a Hall element, an amplifier, and a polarity reversing switch associated with the amplifier, an output of said Hall element being connected to one input of said amplifier, a second output of said Hall element being connected to an output of said on multiplier circuit, an output of said amplifier being connected to one input of said Hall element, and an output of an adjacent multiplier circuit being connected to a second input of said amplifier.

2. The arrangement of claim 1 wherein said output of said Hall element is connected to said input of said amplifier by way of one contact of said polarity reversing switch and said second output of said Hall element is connected to said output of said one multiplier circuit by way of a second contact of said polarity reversing switch.

3. The arrangement of claim 1 wherein the polarity reversing switch has first and second inputs and first and second outputs, said one input and a second input of said Hall element being connected to the outputs of the polarity reversing switch and said output of said amplifier being connected to said one input of said Hall element via an input of the polarity reversing switch.

4. A circuit arrangement for finding a sum of electrical power outputs for use in a multi-phase electricity meter, said circuit arrangement comprising:

a plurality of multiplier circuits arranged in sequence, said sequence of multiplier circuits having two poles which form the output poles of said circuit arrangement, each multiplier circuit comprising a Hall element, an amplifier, and a polarity reversing switch associated with said amplifier, one output of said Hall element being connected to an input of said amplifier in the corresponding multiplier circuit, a second output of said Hall element being connected to an output of the corresponding multiplier circuit, and an output of said amplifier being connected to one input of said Hall element, wherein
in each multiplier circuit, one output of said Hall element is connected to an input of said amplifier by way of one contact of said polarity reversing switch and a second output of said Hall element is connected to said output of the multiplier circuit by way of a second contact of said polarity reversing switch.

* * * * *